United States Patent
Qiu et al.

(10) Patent No.: US 12,089,475 B2
(45) Date of Patent: Sep. 10, 2024

(54) ARRAY SUBSTRATE AND PREPARATION METHOD THEREOF, DISPLAY DEVICE AND IMAGING METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Haijun Qiu, Beijing (CN); Yuedi He, Beijing (CN); Guoqiang Tang, Beijing (CN); Zhenhua Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 846 days.

(21) Appl. No.: 15/733,811

(22) PCT Filed: Mar. 9, 2020

(86) PCT No.: PCT/CN2020/078370
§ 371 (c)(1),
(2) Date: Nov. 30, 2020

(87) PCT Pub. No.: WO2020/187072
PCT Pub. Date: Sep. 24, 2020

(65) Prior Publication Data
US 2021/0233974 A1    Jul. 29, 2021

(30) Foreign Application Priority Data
Mar. 21, 2019 (CN) .......................... 201910219792.4

(51) Int. Cl.
*H10K 59/65* (2023.01)
*H04N 23/45* (2023.01)
(Continued)

(52) U.S. Cl.
CPC ............. *H10K 59/65* (2023.02); *H04N 23/45* (2023.01); *H04N 23/57* (2023.01);
(Continued)

(58) Field of Classification Search
CPC .... H10K 59/65; H10K 59/122; H10K 59/124; H10K 59/126; H10K 71/00;
(Continued)

(56) References Cited

U.S. PATENT DOCUMENTS 10,510,814 B2   12/2019   Sun et al.
10,623,697 B2   4/2020    Guo et al.
(Continued)

FOREIGN PATENT DOCUMENTS

CN   106847092 A   6/2017
CN   107832749 A   3/2018
(Continued)

OTHER PUBLICATIONS

First Chinese Office Action dated Jul. 16, 2020 for Chinese application No. 201910219792.4, 18 pages.
(Continued)

*Primary Examiner* — Nhan T Tran
(74) *Attorney, Agent, or Firm* — Kinney & Lange, P.A.

(57) ABSTRACT

The present disclosure provides an array substrate and a preparation method thereof, a display device and an imaging method thereof. In one embodiment, an array substrate includes: a base substrate; and a plurality of imaging apertures and a plurality of sensor units on the base substrate, wherein the plurality of imaging apertures are respectively
(Continued)

on the plurality of sensor units, so that each of the imaging apertures corresponds to each of the sensor units one by one.

11 Claims, 3 Drawing Sheets

(51) Int. Cl.
    *H04N 23/57*     (2023.01)
    *H10K 59/122*     (2023.01)
    *H10K 59/124*     (2023.01)
    *H10K 59/126*     (2023.01)
    *H10K 71/00*     (2023.01)
    *H10K 59/12*     (2023.01)

(52) U.S. Cl.
    CPC ......... *H10K 59/122* (2023.02); *H10K 59/124* (2023.02); *H10K 59/126* (2023.02); *H10K 71/00* (2023.02); *H10K 59/1201* (2023.02)

(58) Field of Classification Search
    CPC .. H10K 59/1201; H10K 59/12; H10K 59/121; H04N 23/45; H04N 23/57; H04N 23/60; H01L 27/146
    See application file for complete search history.

(56) References Cited

U.S. PATENT DOCUMENTS

| | | | |
|---|---|---|---|
| 10,825,881 B2 | 11/2020 | Sun et al. | |
| 2004/0263670 A1* | 12/2004 | Yamasaki | H01L 27/14623 348/340 |
| 2005/0103983 A1* | 5/2005 | Yamaguchi | H01L 31/0232 257/E31.127 |
| 2009/0060031 A1* | 3/2009 | Rosiene | H04N 19/63 375/E7.076 |
| 2016/0351615 A1* | 12/2016 | Yanagita | H01L 27/14636 |
| 2019/0006440 A1* | 1/2019 | Sun | H10K 59/65 |
| 2019/0172887 A1* | 6/2019 | Sun | G06V 40/1318 |
| 2019/0260963 A1 | 8/2019 | Guo et al. | |
| 2020/0020753 A1 | 1/2020 | Zhang et al. | |
| 2020/0026899 A1 | 1/2020 | Sun et al. | |
| 2020/0202099 A1 | 6/2020 | Sun et al. | |

FOREIGN PATENT DOCUMENTS

| | | | | |
|---|---|---|---|---|
| CN | 107977632 A | | 5/2018 | |
| CN | 108242453 A | | 7/2018 | |
| CN | 108878501 A | | 11/2018 | |
| CN | 108922905 A | | 11/2018 | |
| CN | 208271897 U | | 12/2018 | |
| CN | 109449181 A | | 3/2019 | |
| CN | 109830495 A | | 5/2019 | |
| CN | 109449181 B | * | 1/2021 | ......... H01L 27/3232 |
| CN | 107977632 B | * | 2/2021 | ........... G06K 9/0004 |

OTHER PUBLICATIONS

Second Chinese Office Action dated Jan. 20, 2021 for Chinese application No. 201910219792.4, 18 pages.
Third Chinese Office Action dated Apr. 8, 2021 for Chinese application No. 201910219792.4, 10 pages.

* cited by examiner

```
Determining an imaging area according to acquired
image information in response to a photographing
mode activation signal, the imaging area
comprising at least one sensor unit corresponding to
the image information
```
  801

```
Notifying the at least one sensor unit corresponding
to the image information to perform an imaging
operation
```
  802

ARRAY SUBSTRATE AND PREPARATION METHOD THEREOF, DISPLAY DEVICE AND IMAGING METHOD THEREOF

CROSS-REFERENCE TO RELATED APPLICATION

This application is a National Stage Application of International Application No. PCT/CN2020/078370, filed on Mar. 9, 2020, which claims priority of Chinese Patent Application No. 201910219792.4, filed on Mar. 21, 2019 in the National Intellectual Property Administration of China, the whole disclosure of which is incorporated herein by reference.

TECHNICAL FIELD

The present disclosure generally relates to the field of display technology, and particularly relates to an array substrate and a preparation method thereof, a display device and an imaging method thereof.

BACKGROUND

With the rapid development of smart terminals, users have put forward requirements for narrow frames and full screens for the display interfaces of terminal devices. However, due to the existence of the front camera, the screen-to-body ratio problem has not been able to find a better solution. In one embodiment, some manufacturers have proposed lifting and pop-up cameras, but these solutions inevitably have many problems such as high cost of mechanical structure and lens dust resistance.

In the related art, the front camera device is usually arranged at the border position of the display device, and this structural arrangement is not conducive to the development of narrow frames and full screens.

SUMMARY

In one aspect, some embodiments of the present disclosure provide an array substrate, comprising: a base substrate; and a plurality of imaging apertures and a plurality of sensor units on the base substrate, wherein the plurality of imaging apertures are respectively located on the plurality of sensor units, so that each of the imaging apertures corresponds to each of the sensor units one by one.

In some embodiments, the plurality of sensor units are arranged to have different thicknesses, so that distances between the plurality of sensor units and the plurality of imaging apertures corresponding to the plurality of sensor units are different.

In some embodiments, the array substrate further comprising: a light-shielding metal layer located on the base substrate, wherein the plurality of imaging apertures are in the light-shielding metal layer.

In some embodiments, the array substrate further comprising: a first source-drain metal layer and a second source-drain metal layer on the base substrate, wherein the plurality of imaging aperture are located in the second source-drain metal layer.

In some embodiments, the array substrate further comprising: a pixel defining layer on the base substrate, and a plurality of openings for arranging light-emitting devices are provided in the pixel defining layer; wherein orthographic projections of the plurality of openings on the base substrate do not overlap with orthographic projections of the plurality of imaging apertures on the base substrate.

In some embodiments, the array substrate further comprising: a flat layer on the base substrate and under the pixel defining layer; wherein the plurality of imaging apertures pass through the pixel defining layer and the flat layer, or the plurality of imaging apertures pass through the flat layer.

In some embodiments, the thickness of each of the imaging apertures is about 3 to 4 microns; and/or, each of the imaging apertures is a circular hole with a diameter of about 5 to 10 microns.

In another aspect, some embodiments of the present disclosure provide a method for preparing an array substrate, comprising: forming a plurality of sensor units on the base substrate by an evaporation process; and forming a plurality of imaging apertures in a metal layer on the plurality of sensor units by a patterning process, wherein the plurality of imaging apertures are respectively located on the plurality of sensor units, so that each of the imaging apertures corresponds to each of the sensor units one by one.

In some embodiments, the plurality of sensor units are respectively formed to have different thicknesses by an evaporation process, so that distances between the plurality of sensor units and the plurality of imaging apertures corresponding to the plurality of sensor units are different.

In some embodiments, the metal layer comprises a light-shielding metal layer formed by a patterning process on the sensor unit, and the imaging apertures are located in the light-shielding metal layer.

In some embodiments, the metal layer comprises a first source-drain metal layer and a second source-drain metal layer formed by a patterning process on the plurality of sensor units, wherein the plurality of imaging apertures are located in the second source-drain metal layer.

In some embodiments, the method further comprising: forming a pixel defining layer on the base substrate by a patterning process; a plurality of openings are formed in the pixel defining layer, and orthographic projections of the plurality of openings on the base substrate do not overlap with orthographic projections of the plurality of imaging apertures on the base substrate.

In some embodiments, the method further comprising: forming a flat layer under the pixel defining layer by a patterning process; making the plurality of imaging apertures to pass through the pixel defining layer and the flat layer by an etching process, or making the plurality of imaging apertures to pass through the flat layer by an etching process.

In another aspect, some embodiments of the present disclosure provide a display device, comprising: the array substrate according to any one of the foregoing embodiments.

In another aspect, some embodiments of the present disclosure provide an imaging method applied to the display device according to any one of the foregoing embodiments, the method comprising: determining an imaging area according to acquired image information in response to a photographing mode activation signal, the imaging area comprising at least one sensor unit corresponding to the image information, and the image information comprising an object distance of an object to be photographed or a focal length of the at least one sensor unit; and notifying the at least one sensor unit corresponding to the image information to perform an imaging operation.

BRIEF DESCRIPTION OF THE DRAWINGS

By reading the detailed description of the non-limiting embodiments with reference to the following drawings, other features, purposes and advantages of the present disclosure will become more apparent.

DETAILED DESCRIPTION OF EMBODIMENTS

Figure 1:
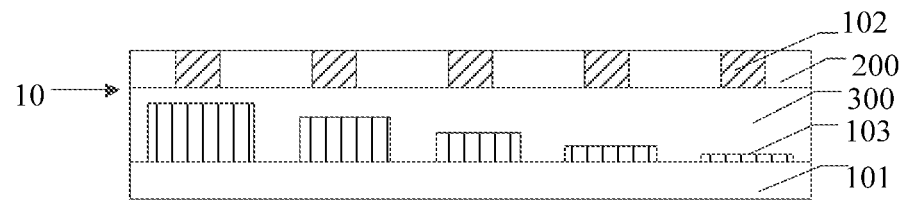
FIG. 1 shows a schematic structural diagram of an array substrate provided by an embodiment of the present disclosure.

The present disclosure will be further described in detail below with reference to the drawings and embodiments. It may be understood that the specific embodiments described here are only used to explain the relevant disclosure, but not to limit the disclosure. In addition, it should be noted that, for ease of description, only parts related to the disclosure are shown in the drawings.

It should be noted that the embodiments in the present disclosure and the features in the embodiments may be combined with each other if there is no conflict. Hereinafter, the present disclosure will be described in detail with reference to the drawings and in conjunction with embodiments.

In the related art, the front camera device may usually be set at the border position of the display device. Due to the structural requirements of the camera device itself, it needs to occupy a certain position space, so that the expansion of the display screen is limited. The existence of the front camera device is not conducive to the development of narrow frames and full screens.

The present disclosure proposes an array substrate. Please refer to FIG. 1, which shows a schematic structural diagram of an array substrate provided by an embodiment of the present disclosure.

As shown in FIG. 1, the array substrate 10 includes: a base substrate 101; and a plurality of imaging apertures 102 and a plurality of sensor units 103 arranged on the base substrate 101, wherein the plurality of imaging apertures 102 are respectively located on the plurality of sensor units 103, so that each of the imaging apertures 102 corresponds to each of sensor units 103 one by one.

In order to solve the problem that the front camera device occupies the border of the display device in the related art, the technical idea of the present disclosure is to integrate the camera function into the display screen. In the embodiment of the present disclosure, by providing the imaging aperture 102 and the corresponding sensor unit 103 in the display area of the array substrate, the imaging function is integrated in the display area according to the aperture imaging principle, thereby solving the problem that the camera device in the related art occupies the border position of the display device. For the convenience of explanation and description, the layer where the imaging aperture 102 is located is defined as an imaging aperture layer 200, and the layer where the sensor unit 103 is located is defined as an image forming layer 300 herein. It should be noted that, according to different embodiments of the present disclosure, the imaging aperture may be formed in an independent imaging aperture layer (such as a light-shielding metal layer or a second source-drain metal layer), or may be formed in an original functional layer (for example, a flat layer or a pixel defining layer) of the array substrate. In the latter case, the imaging aperture layer and the original functional layer (such as a flat layer or a pixel defining layer) formed on the array substrate are the same layer, for example, the imaging aperture is formed in the flat layer or the pixel defining layer. It should also be noted that, in order to clearly illustrate the technical solution of the present disclosure, only the structures and/or functions related to the technical solution of the present disclosure are described and explained in this specification, and at the same time, only the structures related to the technical solution of the present disclosure are shown in the drawings. Those skilled in the art should understand that although not shown in this specification and drawings, the array substrate and display device provided by the embodiments of the present disclosure should also include necessary structures and components.

In the array substrate provided by the embodiment of the present disclosure, the base substrate 101 may be a flexible substrate. The flexible substrate refers to a bendable, foldable, or rollable substrate. The material of the flexible substrate may be ultra-thin glass, metal or plastic, for example, polymeric resin, polyimide, etc.

In the array substrate provided by the embodiment of the present disclosure, the imaging aperture layer (that is, the layer where the imaging aperture 102 is located) 200 may be a metal layer. The metal layer may be, for example, a light-shielding metal layer, or may be, for example, a second source-drain metal layer. In the former case, the process is simple and the cost is low, but there is a problem of stray light. In the latter case, the problem of stray light may be solved, and a larger light transmittance may be obtained, but the cost is higher.

In an embodiment, the array substrate may include: a light-shielding metal layer disposed on the base substrate 101, and the imaging aperture is located in the metal layer. At this time, the imaging aperture layer (that is, the layer where the imaging aperture 102 is located) 200 in FIG. 1 is a light-shielding metal layer.

In another embodiment, the array substrate may include: a first source-drain metal layer and a second source-drain metal layer disposed on the base substrate 101, and the imaging aperture is located in the second source-drain metal layer. At this time, the imaging aperture layer (that is, the layer where the imaging aperture 102 is located) 200 in FIG. 1 is the second source-drain metal layer.

When a photographing mode is activated, incident light passes through the imaging aperture 102. According to the aperture imaging principle, when the light from different parts of the object to be photographed reaches the sensor unit 103, an image that is upside down to the object to be photographed is formed in the sensor unit 103. The size of the imaging aperture 102 and the distance between the sensor unit 103 and the imaging aperture 102 (the distance is the image distance) determine the definition of imaging.

The sensor unit 103 may also be referred to as an image sensor, for example, it may be a charge-coupled device (CCD), a complementary metal oxide semiconductor (Complementary Metal Oxide Semiconductor, CMOS), etc. The specific location of the sensor unit is not particularly limited, as long as it may be ensured that the sensor unit is located between the corresponding imaging aperture and the base substrate, and the distance between the imaging aperture and the corresponding sensor unit may meet the imaging requirements. In an embodiment, the sensor unit is directly arranged on the base substrate. In another embodiment, the sensor unit is arranged in other functional layers.

Figures 7, 8:
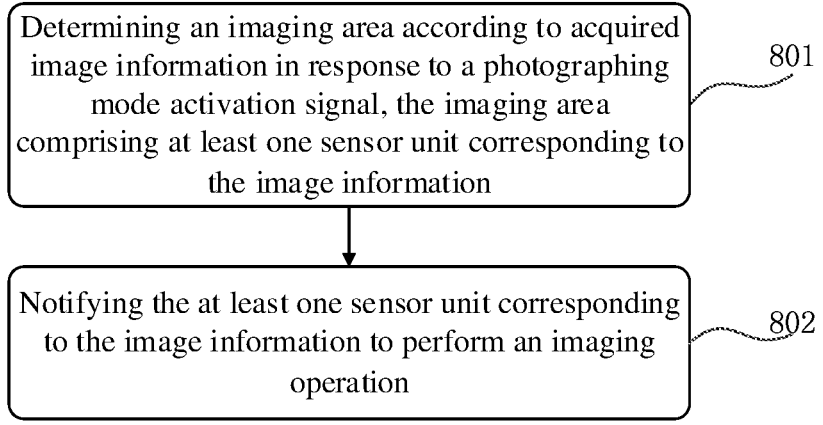
FIG. 7 shows a schematic diagram of imaging area division in an array substrate provided by an embodiment of the present disclosure.
FIG. 8 shows a schematic flowchart of an imaging method of a display device according to an embodiment of the present disclosure.

In the array substrate 10 provided by the embodiment of the present disclosure, considering the imaging requirements of different focal lengths, in the above-mentioned array substrate, the plurality of sensor units 103 may be set to have different thicknesses, so that distances between the plurality of sensor units 103 and the plurality of imaging apertures 102 corresponding to the plurality of sensor units 103 are different. That is, the distances from different sensor units 103 to their corresponding imaging apertures 102 may be set to different values. For example, as shown in FIG. 1, the thicknesses of the sensor units 103 corresponding to different imaging apertures 102 are different. In this way, the distances from the surfaces of the sensor units 103 away from the base substrate 101 (i.e., the imaging plane) to the imaging apertures 102 corresponding to the sensor units 103 may be different. For example, as shown in FIG. 7, the display area may be divided into different imaging areas, and the sensor units 103 included in the different imaging areas may be set to have different thicknesses. It may be understood that, at least one sensor unit 103 contained in the imaging area A11 is set to a first thickness value, at least one sensor unit 103 contained in the imaging area A12 is set to a second thickness value, and so on, the sensor units 103 in different imaging areas have different thickness values. Whether different imaging areas need to be divided may be determined according to the proportion of the imaging area occupying the screen. In one embodiment, the depth of field of one imaging area meets the requirements of the imaging range, and only one imaging area may be used in full screen for the entire display area. If the depth of field of an imaging area may not meet the requirements of the imaging range, the entire display area may be divided into multiple imaging areas according to the proportion of the screen covered.

By providing sensor units 103 with different thicknesses to meet the requirements of different imaging focal lengths, the imaging range is expanded.

Figure 6:
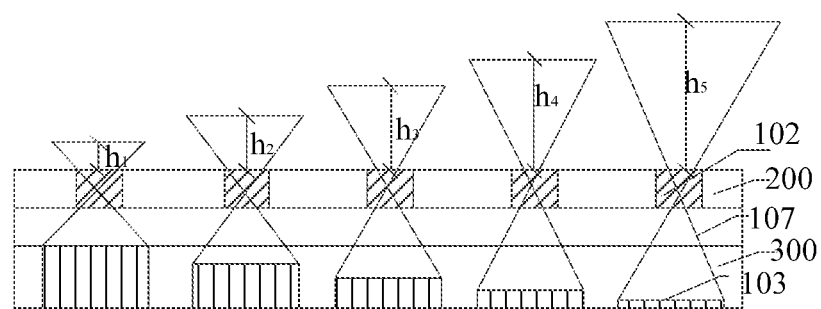
FIG. 6 shows a schematic diagram of the principle that light passes through the imaging aperture to form an image in an image forming layer on an array substrate provided by an embodiment of the present disclosure.

In the array substrate 10 provided by the embodiment of the present disclosure, a buffer layer 107 may also be formed between the imaging aperture layer 200 where the plurality of imaging apertures 102 are located and the image forming layer 300 where the plurality of sensor units 103 are located, as shown in FIG. 6.

Further, considering that the operation of the backlight light source may affect the imaging effect, the embodiment of the present disclosure also proposes another structure of the array substrate. Please refer to FIG. 2, which shows a schematic structural diagram of an array substrate 10 provided by another embodiment of the present disclosure.

Figure 2:
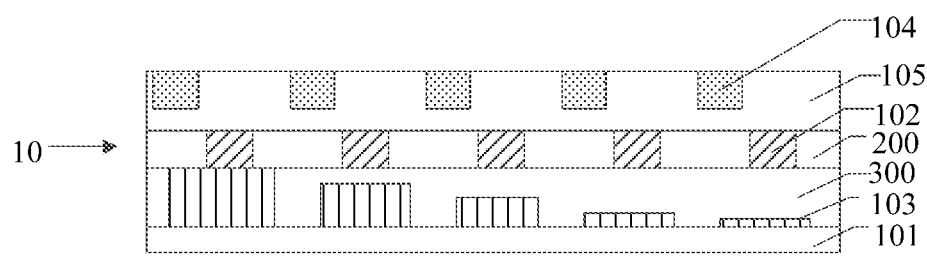
FIG. 2 shows a schematic structural diagram of an array substrate provided by another embodiment of the present disclosure.

As shown in FIG. 2, the array substrate 10 includes: a base substrate 101, a plurality of imaging apertures 102 and a plurality of sensor units 103 arranged on the base substrate 101, and a pixel defining layer 105 arranged on the base substrate 101, where the plurality of imaging apertures 102 are respectively located on the plurality of sensor units 103, so that each of the imaging apertures 102 corresponds to each of the sensor units 103 one by one; a plurality of openings 104 of the light-emitting devices provided in the pixel defining layer 105; orthographic projections of the openings 104 on the base substrate 101 and orthographic projections of the imaging apertures 102 on the base substrate 101 do not overlap. The layer where the plurality of imaging apertures 102 are located is defined as the imaging aperture layer 200, and the layer where the sensor units 103 are located is defined as the image forming layer 300.

In the on embodiments of the present disclosure, the imaging aperture 102, the sensor unit 103, and the opening 104 are all located in the display area of the array substrate 10.

The array substrate provided by the embodiment of the present disclosure realizes the integrated camera function of the display screen based on the aperture imaging principle by providing the imaging aperture layer 200 where the plurality of imaging apertures 102 are located and the image forming layer 300 where the plurality of sensor units 103 are located.

In order to meet the imaging requirements of different focal lengths of the camera function, the plurality of sensor units 103 may be set to have different thickness values, so that the distances between the plurality of sensor units 103 and the plurality of imaging apertures 102 corresponding to the plurality of sensor units 103 are different. In an embodiment, reference may be made to FIG. 6, which shows a schematic diagram of the principle that light passes through the imaging aperture 102 and form an image in the image forming layer 300 where the sensor unit 103 is located. As shown in FIG. 6, wherein h1 to h5 represent the distances from the object to be photographed to the imaging apertures 102, which may generally be referred to as the object distances. In the case of different object distances, in order to form clear imaging results corresponding to different object distances, the positions of the sensor units 103 are needed to be adjusted, so that the distances from imaging planes of the sensor units 103 to the imaging apertures 102 may capture clear images at different object distances. The distance from the imaging plane to the imaging aperture is the image distance, also known as the focal length. In the embodiment of the present disclosure, for example, the plurality of sensor units 103 in the image forming layer 300 may be designed to have different thicknesses, so that the distances between the plurality of sensor units 103 and the plurality of imaging apertures 102 corresponding to the plurality of sensor units 103 are different, and the distance from the imaging aperture meets the focal length setting requirements.

In the embodiments of the present disclosure, it is possible to determine whether to divide the sensor units into areas according to the proportion of the screen occupied by multiple sensor units with different focal lengths when deployed in the display screen. FIG. 7 shows a schematic diagram of imaging area division provided by an embodiment of the present disclosure. As shown in FIG. 7, a plurality of sensor units 103 may be divided into different areas according to different focal lengths. For example, a plurality of sensor units 103 with a first focal length are deployed in the A11 area to form a clear image of an object to be photographed corresponding to the first focal length. The imaging result may correspond to the photographing range of the object distance h1 in FIG. 6. The first focal length is the distance between the sensor unit 103 and the imaging aperture 102 below the mark h1 in FIG. 6. In order to meet the zoom function, a plurality of sensor units 103 with a second focal length may be deployed in the A12 area to form a clear image of the object to be photographed corresponding to the second focal length. The imaging result may correspond to the photographing range of the object distance h2 in FIG. 6. The second focal length is the distance between the sensor unit 103 and the imaging aperture 102 below the mark h2 in FIG. 6. By analogy, the entire display area may be divided into multiple sub-areas according to the proportion of the screen occupied by the divided area, and each sub-area corresponds to an imaging area with a different photographing focal length.

When taking pictures, if the backlight light source is operating, the light emitted by it may affect the imaging aperture in the photographing mode, resulting in poor image effect formed by the imaging aperture. In the embodiment of the present disclosure, by setting the position of the orthographic projection of the opening 104, which is used for arranging the light-emitting device, on the base substrate and the position of the orthographic projection of the imaging aperture 102 on the base substrate to not overlap, the problem of poor imaging effect caused by backlight is solved.

Further, in order to avoid stray light from affecting the imaging result, resulting in poor imaging effect, the layer where the imaging aperture 102 is located (i.e., the imaging aperture layer 200) may be made of a light-shielding material to block visible light. In an embodiment, the material of the layer where the imaging aperture 102 is located may be selected to include polyimide and a black light-absorbing substance doped in polyimide to block visible light, thereby improving imaging quality.

Further, the display device as a whole is developing toward an ultra-thin direction. In order to obtain a better imaging effect, the thickness of the imaging aperture 102 may also be set to about 3 to 4 μm, and this value range may have both imaging effect and ultra-thin performance.

In the embodiment of the present disclosure, a plurality of imaging apertures 102 may also be evenly distributed in the entire display area. The shape of the imaging aperture 102 may be set in various shapes. According to light transmission effect of the imaging aperture 102, it may be set in a circular-hole shape, for example, the diameter is set to be about 5 to 10 μm.

In the embodiment of the present disclosure, when the imaging aperture 102 is provided, it may be considered to further save the vertical space of the display device and compress the display device. Please refer to FIG. 3, which shows a schematic structural diagram of an array substrate 10 according to another embodiment of the present disclosure. The following mainly describes the difference between the embodiment shown in FIG. 3 and the foregoing embodiment.

Figure 3:
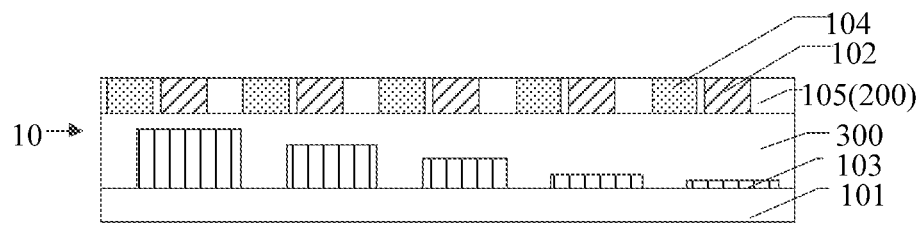
FIG. 3 shows a schematic structural diagram of an array substrate provided by another embodiment of the present disclosure.

As shown in FIG. 3, the pixel defining layer 105 where the plurality of openings 104 for arranging the light-emitting devices are located and the flat layer (not shown in the figure) located between the base substrate 101 and the pixel defining layer 105 both are used as an imaging aperture layer 200 where a plurality of imaging apertures 102 are located. That is, the pixel defining layer 105, the flat layer, and the imaging aperture layer 200 share the same layer, that is, they are the same layer. At this time, it may be understood that the imaging aperture 102 passes through the pixel defining layer 105, the flat layer, and the imaging aperture layer 200.

In an alternative embodiment not shown, the flat layer located between the base substrate and the pixel defining layer where the plurality of openings for arranging the light-emitting device are located may be used as the imaging aperture layer where the plurality of imaging apertures are located. That is, the flat layer and the imaging aperture layer share the same layer. At this time, it may be understood that the imaging aperture passes through the flat layer and the imaging aperture layer at the same time.

In the embodiments of the present disclosure, by designing the flat layer or both the flat layer and the pixel defining layer to share the same layer with the imaging aperture layer, the thickness space of the display device may be effectively saved, and a better imaging effect may be obtained.

In order to further clearly describe the process of preparing the array substrate provided by the embodiment of the present disclosure, the embodiment of the present disclosure also provides a method for preparing the array substrate, the method includes:

forming a plurality of sensor units 103 on the base substrate 101 by an evaporation process;

forming a metal layer, in which a plurality of imaging apertures 102 are formed, on the plurality of sensor units 103 by a patterning process, wherein the plurality of imaging apertures 102 are respectively on the plurality of sensor units 103, so that each of the imaging apertures 102 corresponds to each of the sensor units 103 one by one, and its structure is shown in FIG. 1.

Further, the sensor unit 103 may form photosensitive layers of different thicknesses by an evaporation process. For example, a certain sensor unit 103 or a certain group of (a plurality of) sensor units 103 may form a photosensitive layer with the same thickness by an evaporation process, or form a plurality of photosensitive layers by a plurality of evaporation processes to form the same thickness.

In the embodiments of the present disclosure, a metal layer may be formed on the base substrate 101 by a patterning process. The metal layer may be a light-shielding metal layer, or form a first source-drain metal layer and a second source-drain metal layer. The patterning process includes: partial or all processes of a photoresist coating, a masking, an exposure, a development, an etching, a photoresist stripping, and so on.

Figure 4:
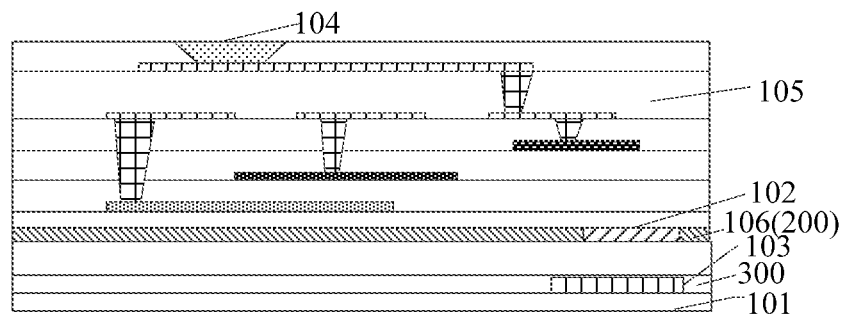
FIG. 4 shows a schematic diagram of distribution position of an imaging aperture in a display area provided by an embodiment of the present disclosure.

In the embodiments of the present disclosure, a dry etching process may be used to form the imaging apertures in the above-mentioned metal layer. In one embodiment, as shown in FIG. 4, FIG. 4 shows a schematic diagram of the distribution position of the imaging aperture 102 in the display area provided by an embodiment of the present disclosure. For the purpose of clarity, although FIG. 4 illustrates the basic structure of the array substrate, only the functional layers related to the technical solutions of the embodiments of the present disclosure in the array substrate are marked with numbers.

After the base substrate 101 is prepared, the image forming layer 300 is formed by an evaporation process. The image forming layer 300 may include a plurality of sensor units 103 (only one is shown in the figure) having different thicknesses.

Then, a light-shielding metal layer (may be simply referred to as the light-shielding layer 106) is formed on the image forming layer 300 by a patterning process, which may be one layer or multiple layers. A photoresist is formed on the light-shielding layer 106, and a patterned mask is used to expose and develop the photoresist to form a photoresist mask; then, the light-shielding layer 106 is dry-etched using the photoresist mask to form an imaging aperture 102.

Figure 5:
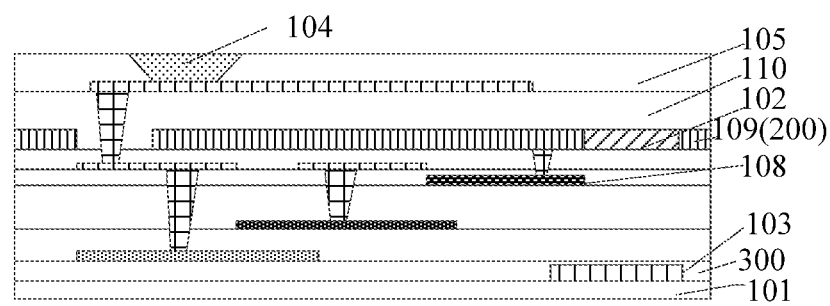
FIG. 5 shows a schematic diagram of a distribution position of an imaging aperture in a display area provided by another embodiment of the present disclosure.

In FIG. 4, the layer (the imaging aperture layer 200) where the imaging aperture 102 is located is the light-shielding layer 106. The light-shielding layer 106 is provided on the base substrate 101, and the original functional layers of the array substrate (including but not limited to the pixel defining layer 105, etc.) are provided on the light-shielding layer 106. It may also be as shown in FIG. 5, which shows another schematic diagram of the distribution position of the imaging aperture 102 in the display area provided by another embodiment of the present disclosure. For the purpose of clarity, although FIG. 5 illustrates the basic structure of the array substrate, only the functional layers in the array substrate related to the technical solutions of the embodiments of the present disclosure are marked with numbers.

After the base substrate 101 is prepared, the image forming layer 300 is formed by an evaporation process. The image forming layer 300 may include a plurality of sensor units 103 (only one is shown in the figure) having different thicknesses.

It may also be understood that the sensor unit is formed in a buffer layer with a different material by an evaporation process.

Then, a light-shielding metal layer is formed on the image forming layer 300 by a patterning process, which may be one layer or multiple layers.

An active layer, a first gate insulating layer, a first gate metal layer, a second gate insulating layer, a second gate metal layer, an interlayer dielectric layer, a first source-drain metal layer 108, a passivation layer, a second source-drain metal layer 109, a flat layer 110, a anode layer, and a pixel defining layer 105 are sequentially formed by patterning processes on the light-shielding layer.

After forming the first source-drain metal layer 108 by a film forming method such as magnetron sputtering and thermal evaporation, the pattern of the passivation layer is formed by a method such as PECVD (Plasma Enhanced Chemical Vapor Deposition). Then, the second source-drain metal layer 109 is formed by a film forming method such as magnetron sputtering and thermal evaporation.

A photoresist is formed on the second source-drain metal layer 109, and a patterned mask is used to expose and develop the photoresist to form a photoresist mask; then, the second source-drain metal layer 109 is dry-etched using the photoresist mask to form the imaging apertures 102.

In an embodiment not shown in the figure, a flat layer may be formed after the second source-drain metal layer is formed, a photoresist is formed on the flat layer, and a patterned mask is used to expose and develop the photoresist to form a photoresist mask; then, the flat layer is dry-etched or wet-etched using the photoresist mask to form the imaging apertures, which pass through the flat layer and the second source-drain metal layer.

In an embodiment not shown in the figure, the anode layer may be formed after the flat layer is formed, and after the anode layer is formed, the pixel defining layer is formed, and a photoresist is formed on the pixel defining layer, and a patterned mask is used to expose and develop the photoresist to form a photoresist mask; then, the pixel defining layer is dry-etched or wet-etched using the photoresist mask to form imaging apertures, which pass through the pixel defining layer and the flat layer.

In the embodiment shown in FIG. 5, after the imaging aperture 102 is formed, the pixel defining layer 105 on the base substrate 101 is wet-etched with an opening 104, which is used to place a light-emitting device. An orthographic projection of the opening 104 and an orthographic projection of the imaging aperture 102 on the base substrate do not overlap.

It may be seen from FIGS. 4 and 5 that, in the array substrate according to the embodiment of the present disclosure, the imaging function structure composed of the imaging aperture 102 and the sensor unit 103 may be arranged at the peripheral position of the original functional layer of the array substrate, so as to not affect the operation of the original functional layer.

When preparing the imaging aperture, considering the imaging effect, the layer where the imaging aperture 102 is located may be made of a light-shielding material to block visible light. The thickness of the imaging aperture may also be set to 3 to 4 µm. This thickness value may meet the development needs of ultra-thin performance while obtaining better imaging results.

The light-shielding material of the layer where the imaging aperture is located may be selected from polyimide and black light-absorbing substances doped in polyimide. Wherein the black light-absorbing substances may be similar to the material used in the black matrix in the liquid crystal display technology or carbon black.

In an embodiment, the imaging aperture may be set as a circular hole with a diameter of 5 to 10 µm, and the imaging apertures are evenly distributed in the entire display area according to the area of the display area.

An embodiment of the present disclosure also provides a display device, which includes the array substrate 10 described in any of the foregoing embodiments. The display device provided by the embodiment of the present disclosure integrates the camera function on the display screen, which prevents the front camera device from occupying the border position of the display device, and facilitates the realization of a narrow-frame screen and a full screen.

In order to more clearly describe the imaging principle of the display device provided by the embodiment of the present disclosure, please refer to FIG. 8, which shows a schematic flowchart of the imaging method of the display device provided by the embodiment of the present disclosure. The imaging method of the display device provided by the embodiment of the present disclosure includes at least the following two steps.

Step 801, determining an imaging area according to acquired image information in response to a photographing mode activation signal, and the imaging area comprising at least one sensor unit corresponding to the image information.

Step 802, notifying the at least one sensor unit corresponding to the image information to perform an imaging operation.

When the photographing mode is activated, light from various parts of the object to be photographed passes through the imaging apertures 102 evenly distributed in the display area, and is directly transmitted to the sensor unit 103, and the sensor unit 103 records and transmits the light signal to the image processor. The image processor determines the imaging area for imaging according to the light signal transmitted by the sensor unit 103. Wherein the imaging area may include one or more sensor units 103 located in the display area corresponding to a certain focal length. And after determining one or more sensor units 103 for imaging, the image processor notifies the one or more sensor units 103 to start forming an image of the object to be photographed.

The image information, for example, may be the object distance between the object to be photographed and the imaging aperture determined by the image processor according to the light signal transmitted by the sensor unit 103, or the focal length between the imaging plane of the sensor unit and the imaging aperture determined by the image processor.

In the embodiments of the present disclosure, the imaging aperture and the corresponding sensor unit are arranged on the base substrate, that is, the imaging function is integrated into the display screen based on the aperture imaging principle, thereby overcoming the problem that the front camera device needs to occupy the border position of the display device in the related art, which is conducive to the development of a narrow-frame screen and a full screen. In addition, by setting different thicknesses of the sensor units, the distances between the plurality of sensor units and the plurality of imaging apertures corresponding to the plurality of sensor units are different, so as to meet the imaging requirements of different depths of field. In addition, the shape and size of the imaging aperture and the material of the layer where the imaging aperture is located may also be designed to improve photographing clarity. In addition, the vertical space of the display device may be compressed through the settings of sharing the same layer.

The foregoing description is only an exemplary embodiment of the present disclosure and an explanation of the applied technical principles. Those skilled in the art should understand that the scope of the disclosure involved in this disclosure is not limited to the technical solutions formed by the specific combination of the on technical features, and should also cover other technical solutions formed by any combination of the on technical features or its equivalent features without departing from the foregoing disclosure concept. For example, the above-mentioned features and the technical features disclosed in the present disclosure (but not limited to) with similar functions are mutually replaced to form a technical solution.

What is claimed is:

1. An array substrate, comprising:
   a base substrate; and
   a plurality of imaging apertures and a plurality of sensor units on the base substrate, wherein the plurality of imaging apertures are respectively located on the plurality of sensor units, so that each of the imaging apertures corresponds to each of the sensor units one by one, and
   a pixel defining layer on the base substrate, a plurality of openings for arranging light-emitting devices being provided in the pixel defining layer,
   wherein the plurality of sensor units are arranged to have different thicknesses, so that distances between the plurality of sensor units and the plurality of imaging apertures corresponding to the plurality of sensor units are different; and
   wherein orthographic projections of the plurality of openings on the base substrate do not overlap with orthographic projections of the plurality of imaging apertures on the base substrate.

2. The array substrate according to claim 1, further comprising: a light-shielding metal layer on the base substrate, wherein the plurality of imaging apertures are located in the light-shielding metal layer.

3. The array substrate according to claim 1, further comprising: a first source-drain metal layer and a second source-drain metal layer on the base substrate, wherein the plurality of imaging apertures are located in the second source-drain metal layer.

4. The array substrate according to claim 1, further comprising:
   a flat layer on the base substrate and under the pixel defining layer;
   wherein the plurality of imaging apertures pass through the pixel defining layer and the flat layer, or the plurality of imaging apertures pass through the flat layer.

5. The array substrate according to claim 1, wherein:
   a thickness of each of the imaging apertures is about 3 to 4 microns; and/or
   each of the imaging apertures is a circular hole with a diameter of about 5 to 10 microns.

6. A display device, comprising: the array substrate according to claim 1.

7. An imaging method applied to the display device according to claim 6, the method comprising:
   determining an imaging area according to acquired image information in response to a photographing mode activation signal, the imaging area comprising at least one sensor unit corresponding to the image information, and the image information comprising an object distance of an object to be photographed or a focal length of the at least one sensor unit; and
   notifying the at least one sensor unit corresponding to the image information to perform an imaging operation.

8. A method for preparing an array substrate, comprising:
   forming a plurality of sensor units on a base substrate by an evaporation process; and
   forming a plurality of imaging apertures in a metal layer on the plurality of sensor units by a patterning process, wherein the plurality of imaging apertures are respectively located on the plurality of sensor units, so that each of the imaging apertures corresponds to each of the sensor units one by one,
   wherein the plurality of sensor units are respectively formed to have different thicknesses by an evaporation process, so that distances between the plurality of sensor units and the plurality of imaging apertures corresponding to the plurality of sensor units are different;
   wherein the method for preparing an array substrate further comprises forming a pixel defining layer on the base substrate by a patterning process; and
   wherein a plurality of openings are formed in the pixel defining layer, and orthographic projections of the plurality of openings on the base substrate do not overlap with orthographic projections of the plurality of imaging apertures on the base substrate.

9. The method for preparing the array substrate according to claim 8, wherein the metal layer comprises a light-shielding metal layer formed by a patterning process on the sensor units, and the imaging apertures are located in the light-shielding metal layer.

10. The method for preparing the array substrate according to claim 8, wherein the metal layer comprises a first source-drain metal layer and a second source-drain metal layer formed by a patterning process on the plurality of sensor units, wherein the plurality of imaging apertures are located in the second source-drain metal layer.

11. The method for preparing the array substrate according to claim 8, further comprising:
   forming a flat layer under the pixel defining layer by a patterning process; and
   making the plurality of imaging apertures to pass through the pixel defining layer and the flat layer by an etching process, or making the plurality of imaging apertures to pass through the flat layer by an etching process.

* * * * *